(12) United States Patent
Heigl (10) Patent No.: US 7,421,916 B2
(45) Date of Patent: Sep. 9, 2008

(54) MANIPULATOR FOR POSITIONING A TEST HEAD, PARTICULARLY AT A TESTER

(76) Inventor: Hubertus Heigl, Georg-Pickl-Weg 5, München (DE) 80995

( * ) Notice: Subject to any disclaimer, the term of this patent is extended or adjusted under 35 U.S.C. 154(b) by 354 days.

(21) Appl. No.: 11/410,014

(22) Filed: Apr. 25, 2006

(65) Prior Publication Data

US 2006/0272901 A1    Dec. 7, 2006

(30) Foreign Application Priority Data

Apr. 27, 2005    (DE) ........................ 10 2005 019 564

(51) Int. Cl.
*B25J 1/12* (2006.01)
*B25J 1/02* (2006.01)
*F16M 11/12* (2006.01)

(52) U.S. Cl. ................................... 73/866.5
(58) Field of Classification Search ............... 73/866.5
See application file for complete search history.

(56) References Cited

U.S. PATENT DOCUMENTS 3,160,960 A * 12/1964 Voelker .................. 33/203.12

6,940,273 B2 * 9/2005 Heigl et al. .............. 324/158.1
2006/0177298 A1 * 8/2006 Mueller .................. 414/791.2

FOREIGN PATENT DOCUMENTS

| DE | 4007011 | 9/1991 |
|----|---------|--------|
| DE | 101132489 | 4/2003 |
| WO | 0224400 | 3/2002 |
| WO | 03089834 | 10/2003 |
| WO | 2004070400 | 8/2004 |

* cited by examiner

*Primary Examiner*—Thomas P Noland
(74) *Attorney, Agent, or Firm*—Novak Druce + Quigg, LLP (57) ABSTRACT

A manipulator for positioning a test head, particularly at a tester is provided with a positioner for positioning the test head three-dimensionally and forming a mount. The manipulator comprises furthermore a cradle to which the test head can be secured and which is connected to the positioner. The cradle is connected to a plate comprising at least one first supporting point. The plate is pivotally mounted at the first supporting point about a first axis. To achieve, on the one hand, precise adjustment and, on the other, a certain compliance, the first supporting point is movable between a starting position and an end position relative to the mount in overcoming the effect of a return force.

41 Claims, 6 Drawing Sheets

MANIPULATOR FOR POSITIONING A TEST HEAD, PARTICULARLY AT A TESTER

CROSS REFERENCE TO RELATED APPLICATION

This application claims the priority of German Patent Application No. 10 2005 019 564.4 filed on 27 Apr. 2005, herein incorporated by reference.

FIELD OF THE INVENTION

The invention relates to a manipulator, serving particularly to position a test head at a tester. The manipulator is provided with a positioning means for positioning the test head three-dimensionally and which forms a mount. In addition, the manipulator is provided with a cradle connected to the positioning means and to which the test head is securable. The cradle is connected to a plate comprising at least one first supporting point. The plate is mounted to pivot about a first axis at the first supporting point.

BACKGROUND OF THE INVENTION

The manipulator for positioning a test head normally has a plurality of translational and rotational degrees of freedom in thus being suitable for precisely positioning the test head three-dimensionally. This is why, as a rule, such a manipulator finds application in testing electronic components such as, for instance, integrated circuits (ICs) or wafers. For function testing electronic components it is necessary to precisely locate the relatively heavy test head at a tester. The tester, for example as a device handler or wafer prober, presents the electronic components to the test head for testing. Obtaining a genuine test result when testing electronic components requires precise docking of the test head at the tester. This is why precise, smooth adjustment of the manipulator positioning the test head is a mandatory requirement.

DE 101 32 489 A1 describes a manipulator characterized by precise repeatability in moving the test head. This is mainly due to the manipulator being provided with positioning means for three-dimensionally positioning the test head which feature articulated links for pivoting in the horizontal plane. These articulated links (pivot links) are coupled to carriages for horizontal travel so that any motion of the test head can be split into a translational motion of the carriages and a rotational motion of the articulated links. It is in this way that the positioning means can be adjusted with precise repetition in assuring reliable positioning of the test head.

In addition, DE 40 07 011 C2 describes a manipulator featuring dual articulated links for three-dimensionally positioning a test head. The dual articulated links are linked at a first end articulated to a cradle securing the test head. At a second end the dual articulated links are articulatedly linked to a pivot link which pivots about an upright axis. The pivot link is disposed at a column enabling the pivot link to be additionally linearly positioned vertical. Although the known manipulator, because of its combination of rotational motions of the pivot link and of the dual articulated links, features manifold adjustment capabilities horizontal, repeatable adjustment is only possible with undue complication.

A manipulator serving to position a test head and featuring a cradle comprising a motion mechanism is described in WO 03/089834 A2. The motion mechanism permits implementation of an in/out motion along a first axis, a tumble motion about a second axis orthoganal to the first axis and a theta motion about a third axis orthoganal to both the first axis and also the second axis of the test head secured to the cradle. For this purpose the motion mechanism comprises a slide link which performs the horizontal motion along the first axis. The motion mechanism comprises in addition, slave actuators guided in a curved groove to permit the tumble motion about the second axis. In addition, the motion mechanism features a link swivel-mounted to permit the theta motion about the third axis. This manipulator is additionally provided with locking means for locking the motion mechanism with three degrees of freedom.

WO 02/24400 A2 also discloses a mounting unit for a test head enabling the test head to be levelled. For this purpose the mounting unit features a shiftable slider for varying the position of the test head relative to the mounting unit.

In addition to the precision of the positioning means as needed for repeat adjustment it has been discovered to be expedient to correct the position of the test head by jiggling it manually in docking it to the tester. Correcting the position of the test head in this way facilitates docking but necessitates a certain compliancy of the positioning means or cradle.

A manipulator for positioning a test head provided with a cradle for the test head which generates a certain compliancy reads from WO 2004/070400 A1. The cradle can be pivotally mounted by means of upper and lower articulated links to a bearing plate. The compliancy of the cradle is created by an adjusting mechanism provided with spring elements. The spring elements are arranged so that the cradle can be adjusted relative to the bearing plate in overcoming a return force.

SUMMARY OF THE INVENTION

The invention is based on the object of sophisticating a manipulator to now achieve, on the one hand, precise adjustment and, on the other hand, a certain compliance.

The manipulator in accordance with the invention is based on having discovered how to movably dispose the first supporting point such that the first supporting point can be moved between a starting position and an end position relative to the mount in overcoming a return force. In this way, the supporting point represents a movable supporting articulated link which now makes it possible to endow the plate with a certain compliance as compared to the mount. Despite this compliance due to the motion of the supporting point relative to the mount, precise adjustment of the test head is assured. The reason for this is that the supporting point is movable between a starting position and an end position in overcoming a return force. This return force thus counteracts motion of the supporting point relative to the mount.

In one preferred aspect of the manipulator in accordance with the invention the first axis is oriented horizontal. In this case, the supporting point is movable expediently in a direction vertical or at an angle relative to the mount, in other words comprising at least one vertical component, so that the motion of the supporting point relative to the mount permits a tumble motion of the test head.

The plate of the manipulator in accordance with the invention comprises a second supporting point disposed spaced away from the first supporting point. At the second supporting point the plate is pivotally mounted about a second axis oriented parallel to the first axis. The second axis represents in this way a supporting articulated link assisting in reliably supporting the test head which as a rule is relatively heavy. Preferably, the second supporting point is also devised as a movable supporting articulated link by the second supporting point being movable between a starting position and an end position relative to the mount in overcoming a return force.

It is especially then, when the first axis runs horizontal that it has been discovered to be of advantage when the mount comprises an upper mounting portion supporting the first supporting point, and a lower mounting portion supporting the second supporting point. The upper mounting portion is expediently provided with an upper supporting surface extending at a first angle to the vertical. As an alternative or in addition thereto, the lower mounting portion may also comprise a lower supporting surface extending at a second angle to the vertical. To advantage, the first angle and second angle, although oriented opposing, have the same angular degree so that the supporting points supported by the supporting surfaces in a motion from the starting position to the end position and back more or less follow an arc ensuring a rotational tumble motion of the test head. In this case the angular degree is expediently in the range 0° to 25°. In this context it has been discovered to be an advantage to configure the upper mounting portion and the lower mounting portion as separate components, resulting in a modular design to now make it possible to adapt the inclination of the supporting surface to the particular application simply by changing the mounting portions.

It has been discovered to be particularly an advantage to dispose a linear guide for the first supporting point at the upper supporting surface and/or a linear guide for the second supporting point at the lower supporting surface. The linear guide ensures precisely motion of the supporting point relative to the mount. In addition, the linear guide has the advantage of absorbing any transverse forces and moments as may materialize.

Furthermore, the first supporting point may be provided with a supporting roller supported at the upper supporting surface, and/or the second supporting point with a supporting roller supported at the lower supporting surface. Although, unlike a linear guide, the supporting roller absorbs no transverse forces and moments it contributes towards relatively simple and cost-effective fabrication.

In addition, an articulated link may be disposed at the upper mounting portion and/or at the lower mounting portion. The articulated link is pivotally mounted at a first end about a third axis oriented parallel to the first axis or second axis or it is linked to the second supporting point. In this way the articulated link permits motion of the supporting point relative to the mount.

Depending on the particular application it may be expedient to movably support the first supporting point and the second supporting point by differing means at the mount. Thus, for example, the upper supporting point may be supported by an articulated link and the lower supporting point by a linear bearing or a supporting roller at the mount.

In a further preferred aspect of the manipulator in accordance with the invention an adjusting mechanism is provided for varying the starting position. Varying the starting position permits levelling the plate and thus the test head to permit achieving safe docking of the test head for example at a tester.

The adjusting mechanism preferably comprises a lead screw fixedly mounted in a lead screw bearing, a housing in which a lead screw nut connected to the lead screw is slidingly guided, a first spring element urging the lead screw nut in a first axial direction, and a second spring element urging the lead screw nut in a second axial direction oriented contrary to the first axial direction. The housing is linked articulated to the first supporting point or second supporting point. The spring elements arranged in the housing are supported by the lead screw nut which although adjustable by the lead screw is otherwise fixedly located in thus creating the return force counteracting motion of the supporting point from the starting position into the end position. This counteracting orientation of the first spring element and second spring element ensures that the supporting point bobs about the starting position is thus being capable of assuming an end position located both above and below the starting position. If the spring element is configured, for example, as a helical compression spring, in the first case it is the first spring element test head is compressed and in the other case it is the second spring element. Linking the housing articulated to one of the supporting points ensures that when the plate is moved relative to the mount the position of the housing changes relative to the lead screw nut in thus creating the return force by the first spring element or second spring element.

It is not a mandatory requirement that the housing is directly connected to one of the supporting points; instead, it can be linked articulated to the plate also at some other location depending on the particular application. To achieve an articulated link by relatively simple ways and means the housing is preferably provided with a bush for receiving the first axis or second axis.

It has furthermore been discovered to be of advantage to provide the housing with a slot and the lead screw nut with a protuberance engaging the slot. The protuberance guided in the slot ensures a torsionally rigid arrangement of the lead screw nut so that the lead screw nut is shifted in the axial direction of the lead screw on rotation of the lead screw. The length of the slot dictates the extent by which the lead screw nut is shiftable in the housing.

Preferably the first spring element and/or second spring element is/are biased to ensure that the supporting point is moved relative to the mount only when a force is applied to the plate which exceeds the bias. This prevents the compliance resulting from the motion of the supporting point relative to the mount from counteracting precise adjustment of the test head.

It is furthermore of advantage to secure the lead screw bearing to the mount in achieving a defined location of the lead screw and thus of the lead screw nut relative to the mount. When the upper supporting surface or the lower supporting surface does not extend in the axial direction of the lead screw, it has been discovered to be particularly expedient to dispose the lead screw bearing to pivot about an axis oriented orthogonal to the first axial direction of the lead screw at the mount. This ensures that the housing and thus the lead screw do not counteract motion of the supporting point.

For simple shifting of the lead screw nut in the axial direction of the lead screw the lead screw is expediently devised for being powered by a crank or a motor.

BRIEF DESCRIPTION OF THE DRAWINGS

The manipulator in accordance with the invention will now be detained by way of describing preferred embodiments as shown simply diagrammatically in the drawings in which.

DETAILED DESCRIPTION OF THE PREFERRED EMBODIMENTS

Figure 1:
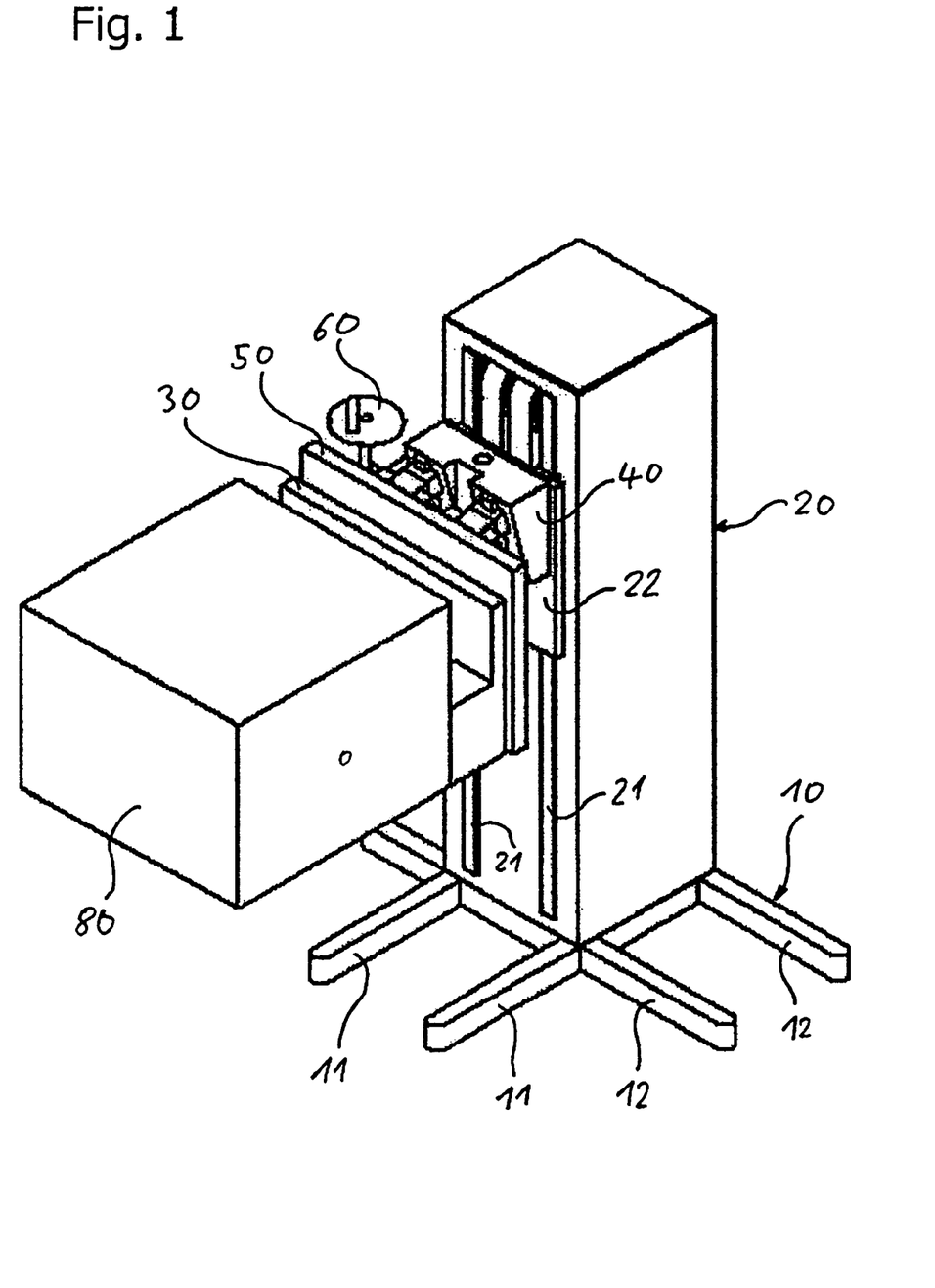
FIG. 1 is a view in perspective of the manipulator on which a test head is arranged.

Referring now to FIG. 1 there is illustrated the manipulator serving to position a test head 80 to a tester (not shown) for eleconic components, such as, for example, integrated circuits or wafers. For this purpose, the manipulator comprises a cradle 30 to which the test head 80 is secured. In addition, the manipulator features positioning means connected to the cradle 30 and which, among other things, comprise a column 20 extending vertical and a vertical carriage 22. The vertical carriage 22 can be linearly moved vertical on two guide rails 21 located parallel to each other, disposed on the column 20 and for this purpose may be powered by drive means. By means of a locking lever the vertical carriage 22 can be locked in a predefined position on the column 20. In addition, further positioning means may be provided on the vertical carriage 22, for instance a horizontal carriage or articulated links pivot mounted in a horizontal plane, known as pivot links from DE 101 32 489 A1, for example.

As evident from FIG. 1 the column 20 is disposed on a base 10. The base 10 comprises two horizontal oriented supporting beams 11 supported by two crossmembers 12 extending orthoganal to the supporting beams 11. To ensure adequate safe standing of the manipulator even when standing on an uneven surface the supporting beams 11 and crossmembers 12 may be mounted on height-adjustable plate feet (not shown). The base 10 may be provided furthermore with a carousel for rotating the column 20 about a vertical axis as is likewise known from DE 101 32 489 A1.

Figure 2:
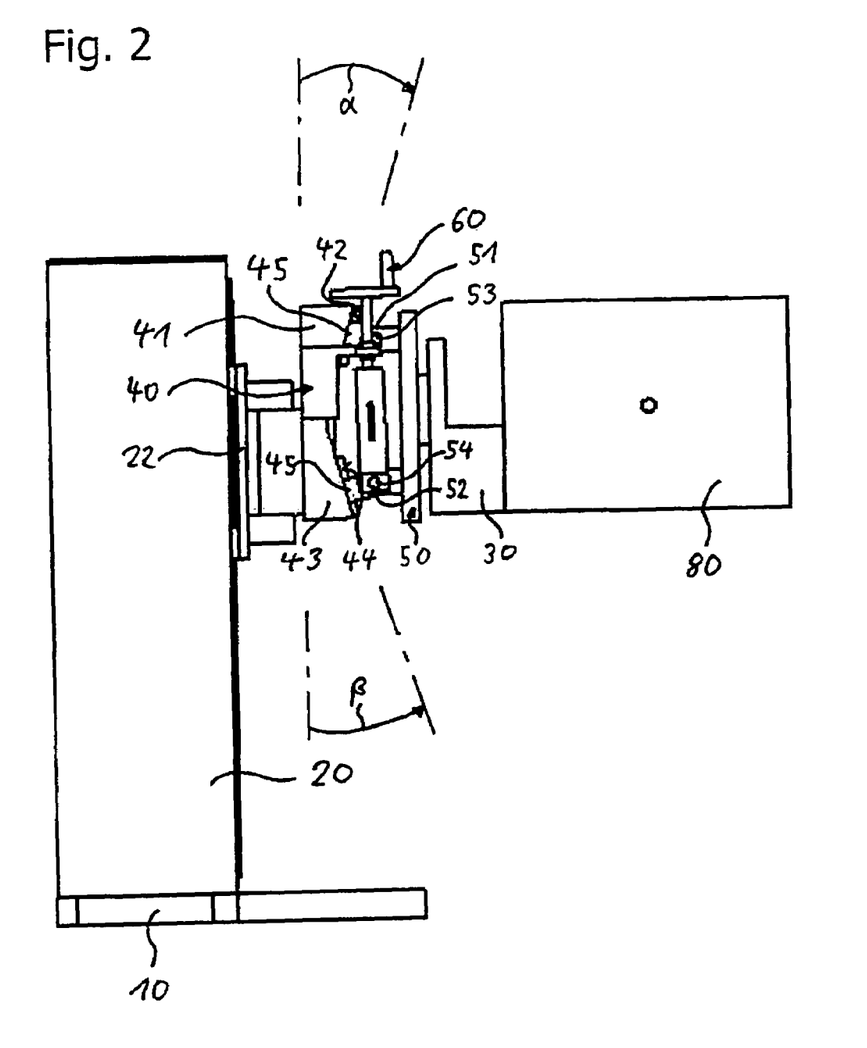
FIG. 2 is a side view of the manipulator as shown in FIG. 1.

Referring now to FIG. 2 there is illustrated in particular how the cradle 30 is connected to a plate 50 supported by a mount 40 which is connected at least indirectly to the vertical carriage 22. The plate 50 comprises a first supporting point 51 and a second supporting point 52 disposed spaced away therefrom. Pivot mounted at the first supporting point 51 is the plate 50 about a first axis 53 oriented horizontal. The plate 50 is furthermore pivot mounted at the second supporting point 52 about an axis 54 which is likewise oriented horizontal. The supporting points 51, 52 thus each represent a link supporting the plate 50 at the mount 40.

The mount 40 comprises an upper mounting portion 41 supporting the first supporting point 51 and a lower mounting portion 43 supporting the second supporting point 52. The upper mounting portion 41 comprises in a first example embodiment an upper supporting surface 42 extending at an angle α to the vertical. The lower mounting portion 43 comprises a lower supporting surface 44 extending at an angle β to the vertical. As evident from FIG. 2 the angles α and β, although oriented opposed, have the same angle, in this case approx. 15°. Disposed at both the upper supporting surface 42 and the lower supporting surface 44 is in each case a linear guide 45 through which the supporting points 51, 52 can be mounted for shifting along the supporting surfaces 42, 44 in thus enabling the supporting points 51, 52 to be moved relative to the mount 40.

Figure 3:
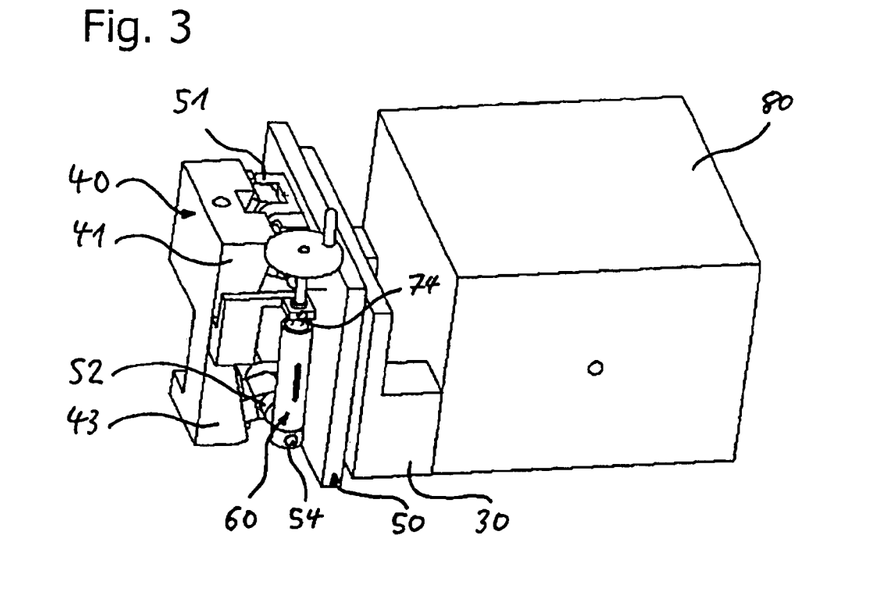
FIG. 3 is a view in perspective of a plate provided with supporting points and of a mount in a first embodiment.
Figure 4:
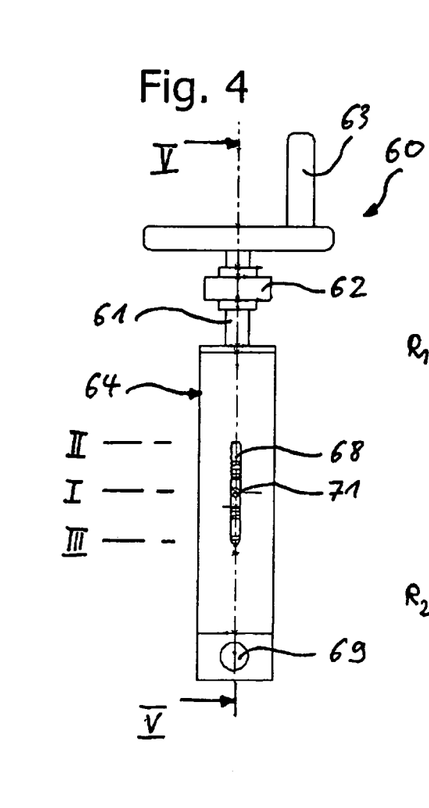
FIG. 4 is a side view of an adjusting mechanism.
Figure 5:
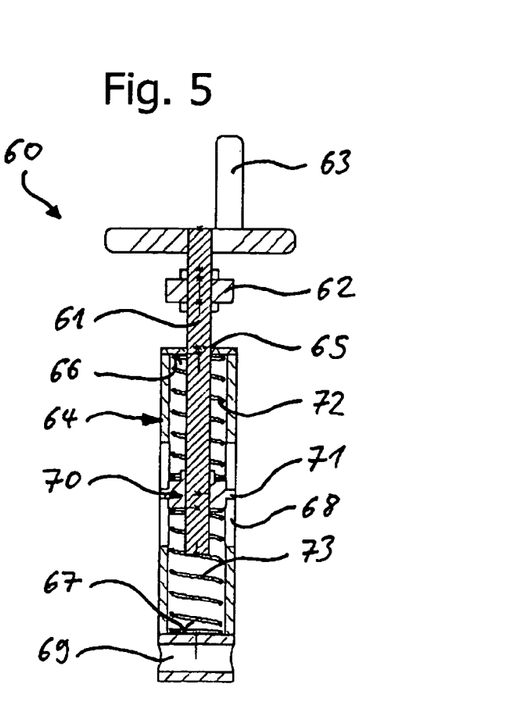
FIG. 5 is a section taken along the line V-V in FIG. 4.

Referring now to FIGS. 3 to 5 there is illustrated furthermore how an adjusting mechanism 60 is disposed at the mount 40, the adjusting mechanism 60 comprising a lead screw 61 fixedly mounted in a lead screw bearing 62 and possibly powered by a crank 63. The adjusting mechanism 60 features in addition, a housing 64, provided on one side with a opening 65 through which the lead screw 61 extends. Shiftably guided in the housing 64 is a lead screw nut 70 connected to the lead screw 61. For this purpose the lead screw nut 70 is provided with a protuberance 71 which engages a slot 68 in the housing 64. The adjusting mechanism 60 comprises in addition, spring elements 72, 73 configured as helical compression springs. The spring element 72 is supported by a contact surface 66 surrounding the opening 65 and urges the lead screw nut 70 in a first axial direction R1. The spring element 73 is supported by a contact surface 67 and urges the lead screw nut 70 in a second axial direction R2 oriented opposing first axial direction R1. The spring elements 72, 73 are biased.

Figure 6:
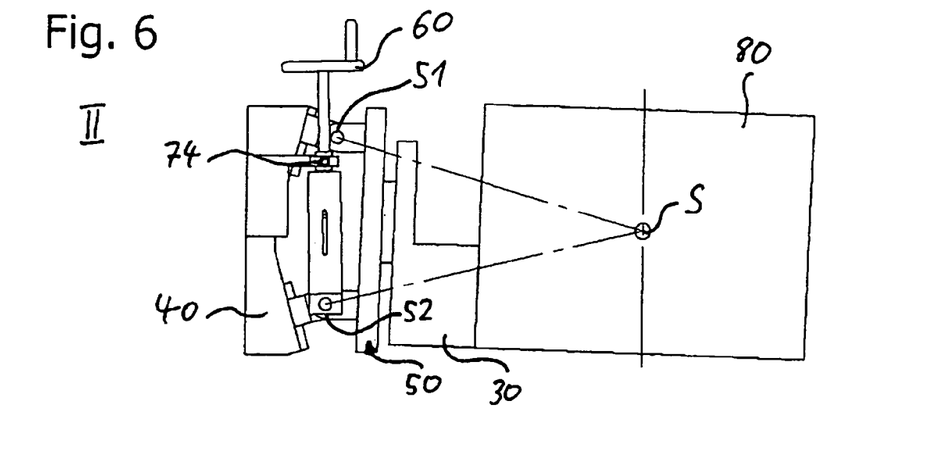
FIG. 6 is a side view of the plate and of the mount showing the supporting points in an upper end position.
Figure 7:
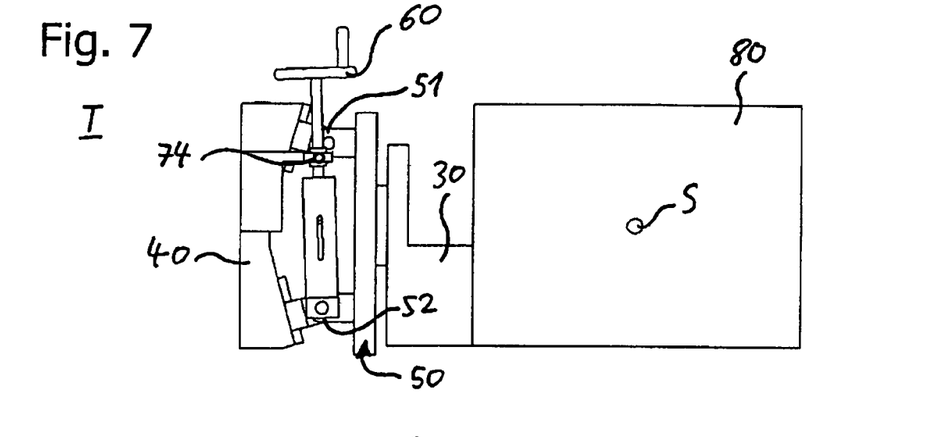
FIG. 7 is a side view as shown in FIG. 6 showing the supporting points in a starting position.
Figure 8:
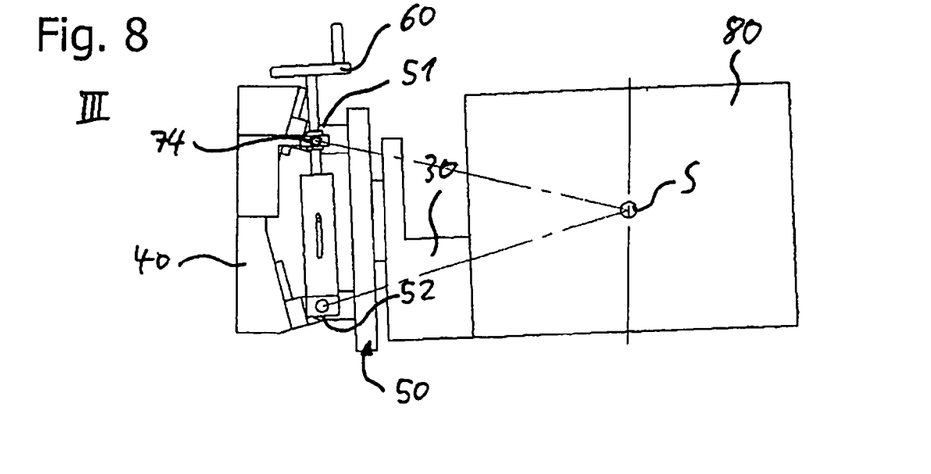
FIG. 8 is a side view as shown in FIG. 6 showing the supporting points in a lower end position.

Referring now to FIG. 3 there is illustrated in particular how the housing 64 is provided furthermore with a bush 69 in which the axis 54 is mounted. It is in this way that the housing 64 is linked articulated to the second supporting point 52. In addition, the lead screw bearing 62 is linked articulated to the mount 40 such that the lead screw bearing 62 is pivotally mounted about a pivot axis 74 oriented orthoganal to the first axial direction R1 or second axial direction R2. The articulated link of the housing 64 with the second supporting point 52 and thus with the plate 50 results in the supporting points 51, 52 being movable in overcoming the return force produced by the spring elements 72, 73 between a starting position I and an end position II, III—see FIGS. 6 to 8—when the plate 50 is moved relative to the mount 40 producing a tumble motion of the test head 80. Referring now to FIG. 4 there is illustrated how the maximum end position II, III as can be assumed by the supporting points 51, 52 is defined by the size of the slot 68. For, the upper edge and length of the slot 68 each constitute a stop for the protuberance 71 which inhibits a continuation of the relative motion of the housing 64 and lead screw nut 70 in the first axial direction R1 or second axial direction R2. It is in this way that due to the mount 40 being coupled to the plate 50 the motion of the plate 50 relative to the mount 40 is also stopped.

The starting position I depends on the location of the lead screw nut 70 relative to the mount 40, the lead screw 61 enabling this relative location to be varied. This is why by means of the adjusting mechanism 60 the starting position I can be varied for levelling the test head 80, for example.

Figure 9:
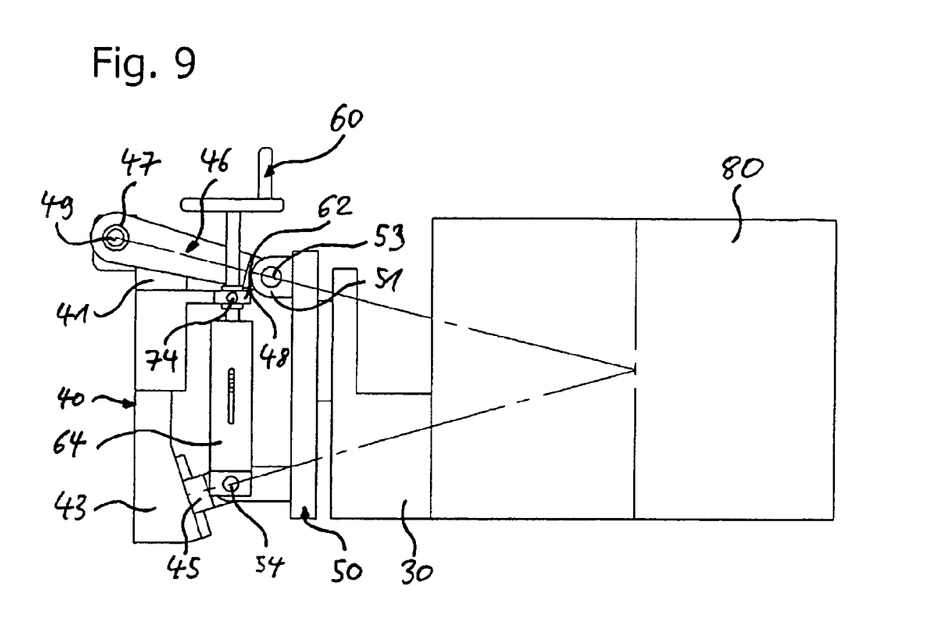
FIG. 9 is a side view of the plate and of the mount in a second embodiment.

Referring now to FIGS. 9 to 12 there is illustrated in each case an embodiment differing from that of the manipulator as described above mainly by the way in which the supporting points 51, 52 are disposed movable at the mount 40. The embodiment as shown in FIG. 9 is provided with an articulated link 46 arranged at the upper mounting portion 41, the articulated link 46 being pivot mounted about an axis 49 oriented parallel to the axis 53 at a first end 47 and linked to the first supporting point 51 at a second end 48. Unlike the linear guide 45 resulting in linear guidance of the supporting points 51, 52 the articulated link 46 makes it possible for the first supporting point 51 to follow an arced motion path.

Figure 10:
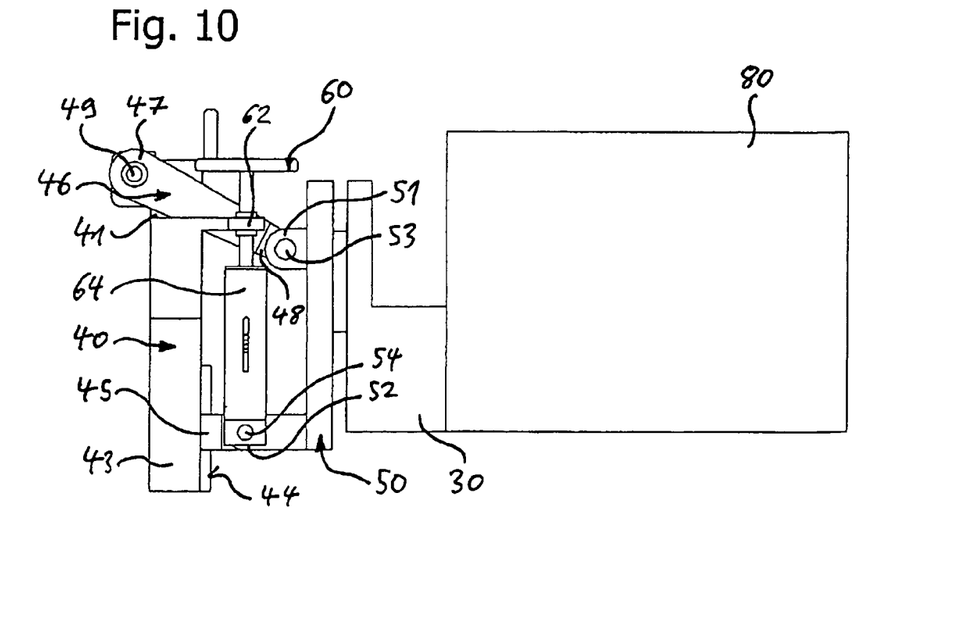
FIG. 10 is a side view of the plate and of the mount in a third embodiment.

Referring now to FIG. 10 there is illustrated an embodiment in which the lower supporting surface 44 extends vertically, in other words the angle □ is 0°, it not being needed in this case to arrange the lead screw bearing 62 for pivoting at the mount 40 since the housing 64 is moved exclusively in the vertical direction.

Figure 11:
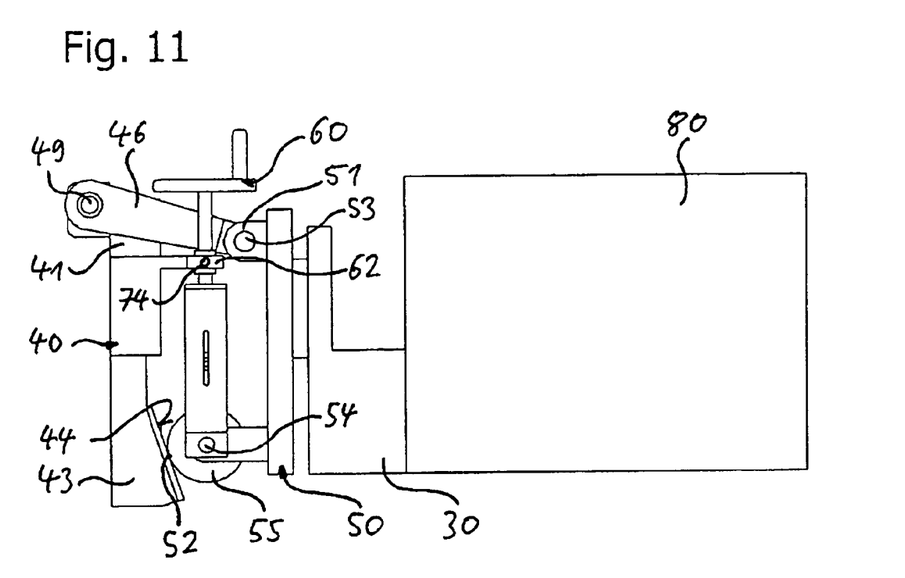
FIG. 11 is a side view of the plate and of the mount in a fourth embodiment.
Figure 12:
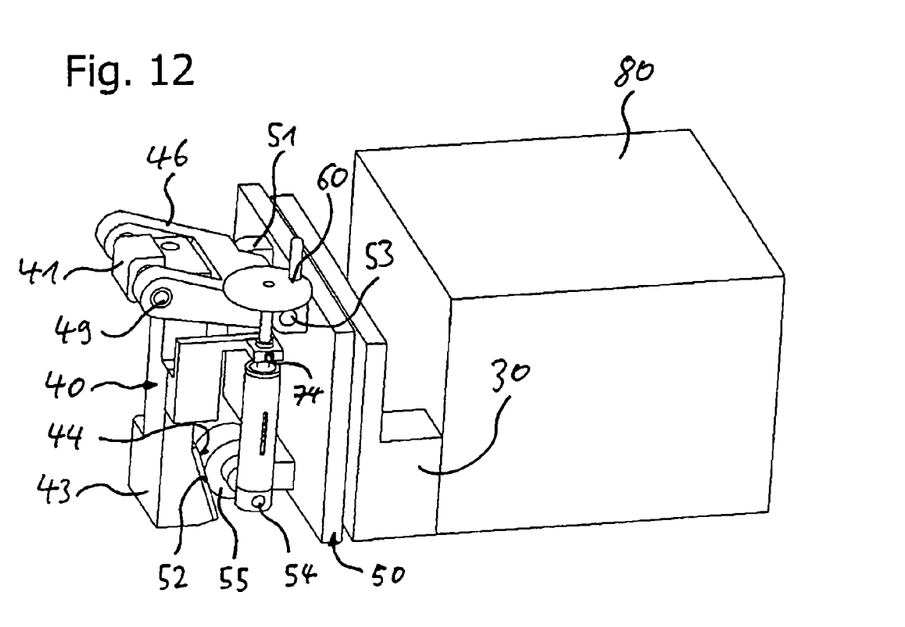
FIG. 12 is a view in perspective of the plate and mount as shown in FIG. 11.

Referring now to FIGS. 11 and 12 there is illustrated an embodiment comprising a supporting roller 55 supported at the lower supporting surface 44 so as to form the movable supporting point 52.

Common to all embodiments of a manipulator as described above is that they, on the one hand, ensure precise adjustment of the test head 80 whilst, on the other, provide a certain compliance facilitating docking the test head 80 to, for example, a tester. The reason for this is that the supporting points 51, 52 are movable relative to the mount 40 so that the plate 50 can be tilted in thus enabling the test head 80 to perform a tumble motion. The compliance materializing from the plate 50 being movable relative to the mount 40 can be varied by biasing the spring elements 72, 73 in thus adapting to the particular application. At the same time the bias ensures that the motion of the plate 50 relative to the mount 40 is possible in overcoming the return force prompted by the spring elements 72, 73 simply by the force acting on the plate 50 exceeding the bias so that despite the compliance, precise adjustment of the test head 80 is assured. Last but not least, the adjusting mechanism 60 permits varying the starting position I about which the supporting points 51, 52 bob in overcoming the return force prompted by the spring elements 72, 73 in thus enabling the test head 80 to be levelled.

LIST OF REFERENCE SIGNS 10 base
11 supporting beam
12 crossmember
20 column
21 guide rail
22 vertical carriage
30 cradle
40 mount
41 upper mounting portion
42 upper supporting surface
43 lower mounting portion
44 lower supporting surface
45 linear guide
46 articulated link
47 first end
48 second end
49 third axis
50 plate
51 first supporting point
52 second supporting point
53 first axis
54 second axis
55 supporting roller
60 adjusting mechanism
61 lead screw
62 lead screw bearing
63 crank
64 housing
65 opening
66 contact surface
67 contact surface
68 slot
69 bush
70 lead screw nut
71 protuberance
72 first spring element
73 second spring element
74 pivot axis
80 test head
I starting position
II end position
III end position
$R_1$ first axial direction
$R_2$ second axial direction
S center of gravity
α first angle
β second angle

What is claimed is:

1. A manipulator for positioning a test head, comprising:
   positioning means for positioning said test head three-dimensionally and forming a mount, and
   a cradle to which said test head can be secured and which is connected to said positioning means, said cradle being connected to a plate;
   said plate comprising at least one first supporting point and a second supporting point spaced away from said first supporting point;
   said plate being pivotally mounted at said first supporting point about a first axis and at said second supporting point about a second axis oriented parallel to said first axis;
   said first supporting point and said second supporting point being movable between a starting position and an end position relative to said mount in overcoming the effect of a return force;
   said mount comprising an upper mounting portion supporting said first supporting point and a lower mounting portion supporting said second supporting point;
   said upper mounting portion comprising an upper supporting surface and said lower mounting portion comprising a lower supporting surface;
   at said upper supporting surface a linear guide being disposed by means of which said first supporting point being movably mounted along said upper supporting surface, and
   at said lower supporting point a linear guide being disposed by means of which said second supporting point being movably mounted along said lower supporting surface.

2. The manipulator as set forth in claim 1, wherein said first axis is oriented horizontally.

3. The manipulator as set forth in claim 1, wherein said upper supporting surface extends at a first angle to the vertical.

4. The manipulator as set forth in claim 3, wherein said lower supporting surface extends at a second angle to the vertical.

5. The manipulator as set forth in claim 4, wherein said first angle and second angle are oriented opposed and have the same amount.

6. The angle as set forth in claim 5, wherein the amount of the first angle and the second angle is in the range of 0° and 25°.

7. The manipulator as set forth in claim 1, comprising an adjusting mechanism by means of which said starting position is variable.

8. The manipulator as set forth in claim 7, wherein for varying the starting position said adjusting mechanism comprises
   a lead screw being fixedly mounted in a lead screw bearing;
   a housing in which a lead screw nut connected to said lead screw being shiftably guided;
   a first spring element urging said lead screw nut in a first axial direction;
   a second spring element urging said lead screw nut in a second axial direction opposite said first axial direction;
   said housing being articulatedly linked to said first supporting point or said second supporting point.

9. The manipulator as set forth in claim 8, wherein said housing being provided with a bush.

10. The manipulator as set forth in claim 8, wherein said housing being provided with a slot and said lead screw nut comprising a protuberance engaging said slot.

11. The manipulator as set forth in claim 8, wherein said first spring element or said second spring element being biased.

12. The manipulator as set forth in claim 8, wherein said lead screw bearing being secured to said mount, said lead screw bearing being disposed pivotable about a pivot axis oriented orthogonal to said first axial direction at said mount.

13. The manipulator as set forth in claim 8, wherein said lead screw can be powered by a crank handle or a motor.

14. A manipulator for positioning a test head, comprising:
    positioning means for positioning said test head three-dimensionally and forming a mount, and
    a cradle to which said test head can be secured and which is connected to said positioning means, said cradle being connected to a plate;
    said plate comprising at least one first supporting point and a second supporting point spaced away from said first supporting point;
    said plate being pivotally mounted at said first supporting point about a first axis and at said second supporting point about a second axis oriented parallel to said first axis;
    said first supporting point and said second supporting point being movable between a starting position and an end position relative to said mount in overcoming the effect of a return force;
    said mount comprising an upper mounting portion supporting said first supporting point and a lower mounting portion supporting said second supporting point;
    at said upper mounting portion an articulated link being disposed, said articulated link being pivot mounted at a first end about a third axis oriented parallel to said first axis or said second axis and being linked articulated at a second end to said first supporting point;
    said lower mounting portion being provided with a lower supporting surface, and
    at said lower supporting surface a linear guide being disposed by which said second supporting point is movably mounted along said lower supporting surface.

15. The manipulator as set forth in claim 14, wherein said first axis is oriented horizontally.

16. The manipulator as set forth in claim 14, wherein said upper supporting surface extends at a first angle to the vertical.

17. The manipulator as set forth in claim 16, wherein said lower supporting surface extends at a second angle to the vertical.

18. The manipulator as set forth in claim 17, wherein said first angle and second angle are oriented opposed and have the same amount.

19. The angle as set forth in claim 18, wherein the amount of the first angle and the second angle is in the range of 0° and 25°.

20. The manipulator as set forth in claim 14, comprising an adjusting mechanism by means of which said starting position is variable.

21. The manipulator as set forth in claim 20, wherein for varying the starting position said adjusting mechanism comprises
    a lead screw being fixedly mounted in a lead screw bearing;
    a housing in which a lead screw nut connected to said lead screw being shiftably guided;
    a first spring element urging said lead screw nut in a first axial direction;
    a second spring element urging said lead screw nut in a second axial direction opposite said first axial direction;
    said housing being articulatedly linked to said first supporting point or said second supporting point.

22. The manipulator as set forth in claim 21, wherein said housing being provided with a bush.

23. The manipulator as set forth in claim 21, wherein said housing being provided with a slot and said lead screw nut comprising a protuberance engaging said slot.

24. The manipulator as set forth in claim 21, wherein said first spring element or said second spring element being biased.

25. The manipulator as set forth in claim 21, wherein said lead screw bearing being secured to said mount.

26. The manipulator as set forth in claim 21, wherein said lead screw can be powered by a crank handle or a motor.

27. The manipulator as set forth in claim 21, wherein said lead screw bearing being secured to said mount, said lead screw bearing being disposed pivotable about a pivot axis oriented orthogonal to said first axial direction at said mount.

28. A manipulator for positioning a test head, comprising:
    positioning means for positioning said test head three-dimensionally and forming a mount, and a cradle to which said test head can be secured and which is connected to said positioning means, said cradle being connected to a plate;
    said plate comprising at least one first supporting point and a second supporting point spaced away from said first supporting point;
    said plate being pivotally mounted at said first supporting point about a first axis and at said second supporting point about a second axis oriented parallel to said first axis;
    said first supporting point and said second supporting point being movable between a starting position and an end position relative to said mount in overcoming the effect of a return force;
    said mount comprising an upper mounting portion supporting said first supporting point and a lower mounting portion supporting said second supporting point;
    at said upper mounting portion an articulated link being disposed, said articulated link being pivot mounted at a first end about a third axis oriented parallel to said first axis or said second axis and being linked articulated at a second end to said first supporting point;
    said lower mounting portion having a lower supporting surface, and
    said second supporting point having a supporting roller by which said second supporting point is movably mounted along said lower supporting surface.

29. The manipulator as set forth in claim 28, wherein said first axis is oriented horizontally.

30. The manipulator as set forth in claim 28, wherein said upper supporting surface extends at a first angle to the vertical.

31. The manipulator as set forth in claim 30, wherein said lower supporting surface extends at a second angle to the vertical.

32. The manipulator as set forth in claim 31, wherein said first angle and second angle are oriented opposed and have the same amount.

33. The angle as set forth in claim 32, wherein the amount of the first angle and the second angle is in the range of 0° and 25°.

34. The manipulator as set forth in claim 28, comprising an adjusting mechanism by means of which said starting position is variable.

35. The manipulator as set forth in claim 34, wherein for varying the starting position said adjusting mechanism comprises
- a lead screw being fixedly mounted in a lead screw bearing;
- a housing in which a lead screw nut connected to said lead screw being shiftably guided;
- a first spring element urging said lead screw nut in a first axial direction;
- a second spring element urging said lead screw nut in a second axial direction opposite said first axial direction;
- said housing being articulatedly linked to said first supporting point or said second supporting point.

36. The manipulator as set forth in claim 34, wherein said housing being provided with a bush.

37. The manipulator as set forth in claim 34, wherein said housing being provided with a slot and said lead screw nut comprising a protuberance engaging said slot.

38. The manipulator as set forth in claim 34, wherein said first spring element or said second spring element being biased.

39. The manipulator as set forth in claim 34, wherein said lead screw bearing being secured to said mount.

40. The manipulator as set forth in claim 34, wherein said lead screw can be powered by a crank handle or a motor.

41. The manipulator as set forth in claim 34, wherein said lead screw bearing being secured to said mount, said lead screw bearing being disposed pivotable about a pivot axis oriented orthogonal to said first axial direction at said mount.

* * * * *